(12) United States Patent
Weber et al.

(10) Patent No.: US 7,038,272 B2
(45) Date of Patent: May 2, 2006

(54) METHOD FOR FORMING A CHANNEL ZONE OF A TRANSISTOR AND NMOS TRANSISTOR

(75) Inventors: Hans Weber, Ainring (DE); Dirk Ahlers, München (DE); Uwe Wahl, München (DE); Jenö Tihanyi, Kirchheim (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 153 days.

(21) Appl. No.: 10/631,350

(22) Filed: Jul. 31, 2003

(65) Prior Publication Data

US 2004/0065909 A1    Apr. 8, 2004

(30) Foreign Application Priority Data

Jul. 31, 2002    (DE)    ................. 102 35 000

(51) Int. Cl.
*H01L 29/76*    (2006.01)
(52) U.S. Cl. .............. 257/329; 257/256; 257/285; 438/135; 438/268
(58) Field of Classification Search ........... 257/285, 257/329

See application file for complete search history.

(56) References Cited

U.S. PATENT DOCUMENTS

| 5,736,445 A | 4/1998 | Pfirsch |
| 5,879,968 A * | 3/1999 | Kinzer ................. 438/135 |
| 6,274,904 B1 * | 8/2001 | Tihanyi ................ 257/329 |
| 6,794,251 B1 * | 9/2004 | Blanchard ............. 438/268 |

FOREIGN PATENT DOCUMENTS

GB    2 319 395 A    5/1998

* cited by examiner

*Primary Examiner*—David Nelms
*Assistant Examiner*—Dao H. Nguyen
(74) *Attorney, Agent, or Firm*—Laurence A. Greenberg; Werner H. Stemer; Ralph E. Locher

(57) ABSTRACT

In a method for forming a channel zone in field-effect transistors, a polysilicon layer is patterned above the channel zone to be formed. The polysilicon layer serves as a mask substrate for the subsequent doping of the channel zone. The expedient patterning of the polysilicon layer with holes in a gate region and pillars in a source region enables the channel zone to be doped more lightly. In another embodiment, the novel method is used for a channel width shading of a PMOS transistor cell.

5 Claims, 5 Drawing Sheets

METHOD FOR FORMING A CHANNEL ZONE OF A TRANSISTOR AND NMOS TRANSISTOR

BACKGROUND OF THE INVENTION

FIELD OF THE INVENTION

The invention is concerned generally with the formation of a channel zone below a polysilicon layer of a transistor. In particular, the invention relates to a method for setting a desired doping profile in a p-type well zone of a NMOS field-effect transistor cell, and to a method for limiting the channel width of such a NMOS transistor cell.

A p-type well zone with reduced p-type doping is advantageous for depletion-mode NMOS field-effect transistor cells. During the traditional fabrication thereof, an additional mask is used therefor. The p-type well zone is traditionally formed by an implantation of boron and subsequent diffusion, thereby achieving the desired doping in the channel zone of the NMOS field-effect transistor. In order then to achieve the desired reduced p-type doping, conventionally holes or pillars are formed in the mask, thus resulting in a more lightly p-doped well zone in the cell (cf. U.S. Pat. No. 5,736,445 and German patent DE 19 526 183 C1). If only the gate electrode is perforated with holes, the channel zone remains highly doped and so a p⁻-type layer cannot take effect in the p-type well zone.

Accordingly, the desire that arises here is to enable a NMOS transistor cell with a p-type well zone having reduced p-type doping, without an additional mask, in order to produce a more lightly doped p-type well in a NMOS field-effect transistor cell, for example in a coolMOS™ MOSFET cell (cool-MOS™ is a trademark of Infineon Technologies AG).

The accompanying FIG. 7 shows the family of characteristic curves of a MOS transistor. The operating point A identifies the situation in normal operation, and the straight line passing through the operating point A represents the inverse characteristic curve of an external nonreactive load resistor. For a gate voltage $U_{GS}=U_{GS3}$ the current carried by the transistor at the point A is less than the rated current $I_{rated}$. If a short circuit appears across the load resistor, then the intermediate circuit voltage that is present is dropped across the transistor, and the current/voltage characteristic is determined by the point B. In this case, the current rises more than proportionally, so that the transistor is not short-circuit proof at the gate voltage $U_{GS3}$. For this reason, the safe operating area SOA (area to the left of the dotted curve) has to be heavily circumscribed by current or voltage limiting, in other words at $U_{GS3}$ the usable area through $U_{DS}$ is significantly smaller in comparison with $U_{GS1}$.

This problem is particularly critical in the case of compensation components, since the very low area-specific resistance does not limit the current through the drift region in the short-circuit situation. Therefore, particularly high current densities and a correspondingly rapid heating of the component arise, which ultimately leads to its destruction.

The upward bend in the characteristic curve, as can be seen for example on the connection A→B, is caused by the charge carrier multiplication M in the transistor bulk. If it is desired to improve the short-circuit strength of the transistor at a given gate voltage $U_{GS3}$ then it is necessary to reduce this multiplication. Ultimately, this is achieved by current limiting. In other words, the aim is to assign a smaller drain current to the gate voltage $U_{GS3}$ (in the saturation region of the characteristic curve). However, this means reducing the transconductance of the transistor. The charge carrier multiplication M is a function of the field strength and the current density. Since the field strength is directly coupled to the voltage present, the following relationship holds true:

$$M=M(U_{DS}, I_{DS}) \qquad (1)$$

The multiplication effect can thus be reduced by quasi-limiting of the current $I_{DS}$. The following relationship results for the drain-source current $I_{DS}$:

$$I_{DS}=\beta/2 \cdot (U_{GS}-U_{th}) \qquad (2)$$

where β designates the transconductance of the transistor. The following relationship can be specified for said transconductance β:

$$\beta \propto w/l \cdot C'_{ox} \qquad (3)$$

Consequently, the following holds true:

$$M=M(U_{DS}; w/l \cdot (U_{GS}-U_{th})^2) \qquad (4)$$

wherein w designates the channel width; l designates the channel length; $U_{th}$ designates the threshold voltage; $U_{GS}$ designates the gate-source voltage; $U_{DS}$ designates the drain-source voltage; and M designates the charge carrier multiplication.

Accordingly, reducing the channel width w ("channel width shading") results in a reduction of the charge carrier multiplication M and thus an increased short-circuit strength up to higher gate voltages $U_{GS}$. It must be noted here that the safe operating area SOA remains unchanged despite the channel width shading, since the drain-source current $I_{DS}$ is a parameter which directly influences the charge carrier multiplication M.

With a reduced channel width w, the family of characteristic curves of the MOS transistor assumes the form shown in FIG. 8. Figuratively speaking, the curve assigned to a fixed gate voltage $U_{GS}$ is shifted toward smaller currents $I_{DS}$. The on resistance $R_{DS}$ is not significantly impaired in this case since, in the case of high-voltage components, it is determined hardly at all by channel conditions, but rather critically by bulk conditions (extent of the epitaxial layer). In the bulk, however, the charge carriers, although fed in inhomogeneously, can propagate undisturbed, so that no current constriction is present as a result of the channel width shading.

The accompanying FIG. 9 illustrates how a part of the channel width is shaded in a fabrication process currently used by the applicant in an array of MOS transistor cells. This is done by means of a resist mask 30 which masks the channel terminal implantation. FIG. 9 shows, in diagrammatic plan view, the resist masking 30 of a hole 13 formed for the gate terminal in the polysilicon layer 11. On account of the resist mask 30, only a part t of the channel width is connected:

*t*=unshaded channel width/total channel width.

In a fabrication process currently implemented by Infineon Technologies AG for fabricating coolMOS™ transistor cells, t is about 0.5 (with regard to coolMOS™ technology, reference shall be made to IEEE Transactions on Electron Devices, Volume 49, No. 5, May 2002, Bobby J. Daniel et al.: "Modelling of The Cool MOS™ Transistor—Part 1: Device Physics").

Since the abovementioned resist mask for shading the channel width and the photolithography process required for forming the resist mask increase the costs of the fabrication process, there is the desire to enable a method for shading the channel width without the need for the resist mask and the phototechnology required for producing it, such that the channel width can be reduced to a desired proportion by shading.

SUMMARY OF THE INVENTION

It is accordingly an object of the invention to provide a method of producing a channel zone of a transistor and a PMOS transistor which overcomes the above-mentioned disadvantages of the heretofore-known devices and methods of this general type and which obviates the use of a resist mask in the formation of the channel zone and which utilizes the polysilicon layer that is present anyway as a mask-forming layer.

With the foregoing and other objects in view there is provided, in accordance with the invention, a method for forming a channel zone of a transistor below a polysilicon layer, which comprises:

patterning a polysilicon layer above the channel zone to be formed; and subsequently doping the channel zone and using the patterned polysilicon layer as a mask substrate for doping the channel zone.

In other words, the method according to the invention is which comprises in that the polysilicon layer is patterned above the channel zone to be formed and is used as a mask substrate for the subsequent doping of the channel zone.

In a first embodiment, the method according to the invention provides the following steps in the formation of the channel zone of a NMOS field-effect transistor:

(A) the polysilicon layer is patterned to form holes in the gate region and pillars in the source region;

(B) the channel zone is doped with a desired impurity concentration using the polysilicon layer patterned in step (A) as a doping mask, and (C) the doped channel zone is outdiffused.

As a result, the channel zone is also lightly doped. In step (A), what can be achieved through the choice of at least one of the parameters: form, spacing, number and/or diameter of the holes in the gate region and also by selection of at least one of the parameters: form, spacing, number and/or diameter of the pillars in the source region is that the impurity concentration and/or the diffusion depth of the channel zone in step (C) is greater in the source region than in the gate region.

Consequently, at least one of the variables form, spacing, number and diameter of the holes and pillars in each case in the gate region and in the source region determine the fact that the p-type channel zone in the source region extends deeper into the epitaxial layer than in the gate region, and that the impurity concentration of the p-type channel zone in the source region is greater than the impurity concentration in the gate region.

The method according to the invention is particularly preferably employed for fabricating a depletion-mode MOS field-effect transistor cell, in particular in coolMOS™ field-effect transistor technology.

In accordance with a second embodiment, the method according to the invention serves for the channel width shading of integrated NMOS transistor cells and is distinguished by the following steps:

(A) slots are formed in sections of the polysilicon layer lying above the channel zone, in order to connect the channel zones of adjacent cells, and (B) the p-type dopant is also introduced into the slots in polysilicon, as a result of which the channel zones of adjacent cells are electrically connected after the diffusion.

In order to obtain a desired channel width shading, at least one of the parameters: position, form, spacing, number, width and/or length of the slots can be chosen appropriately.

In an alternative embodiment, the method according to the invention serves for the channel width shading of an integrated NMOS transistor cell and is distinguished by the following steps:

(A1) within the polysilicon hole delimiting the source region, webs are formed from the polysilicon and are short-circuited with the source electrode, and (B1) during the implantation of the p-type dopant, the webs serve as masking.

An NMOS transistor cell fabricated by this method is distinguished by the fact that the transistor cell has slots or webs in sections of the polysilicon layer lying above the channel zone, the slots being introduced such that they connect the channel zones of adjacent transistor cells and the webs being composed of polysilicon, lying within the polysilicon hole delimiting the source region, and being short-circuited with the source electrode.

The afore-mentioned NMOS transistor cell according to the invention is particularly preferably a vertical depletion-mode MOSFET transistor cell, e.g. a coolMOS™-FET transistor cell.

Other features which are considered as characteristic for the invention are set forth in the appended claims.

Although the invention is illustrated and described herein as embodied in a method for forming a channel zone of a transistor and NMOS transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

It should be noted that, while the exemplary embodiments described below relate to a vertical NMOS transistor or vertical NMOS transistor cells, the method according to the invention can also advantageously be applied to lateral MOS transistors and also to bipolar transistors such as, for example, IGBTs and normal MOS transistors.

Figure 1A:
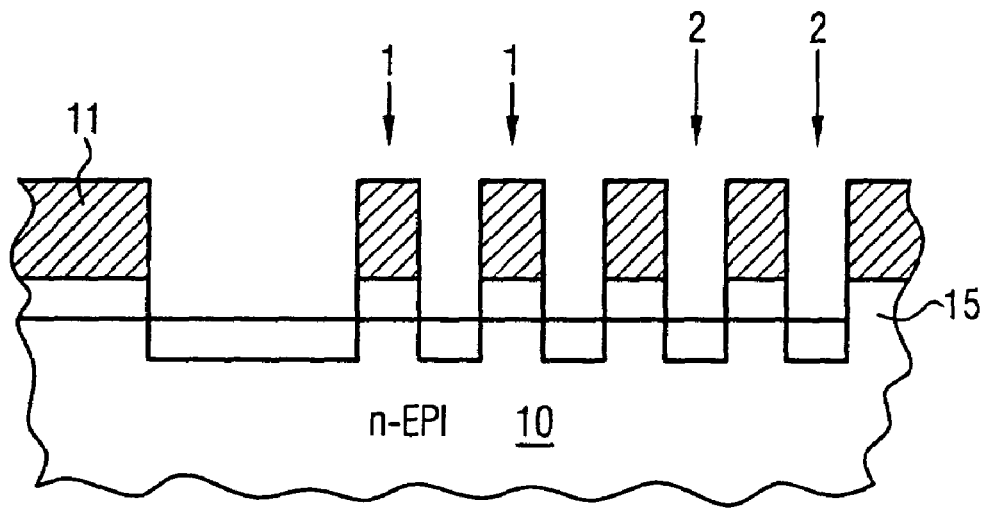
FIGS. 1A and 1B are diagrammatic cross sections through a section of an NMOS-FET transistor cell, illustrating two successive steps of the method according to the invention for forming a more lightly doped channel zone.
Figure 1B:
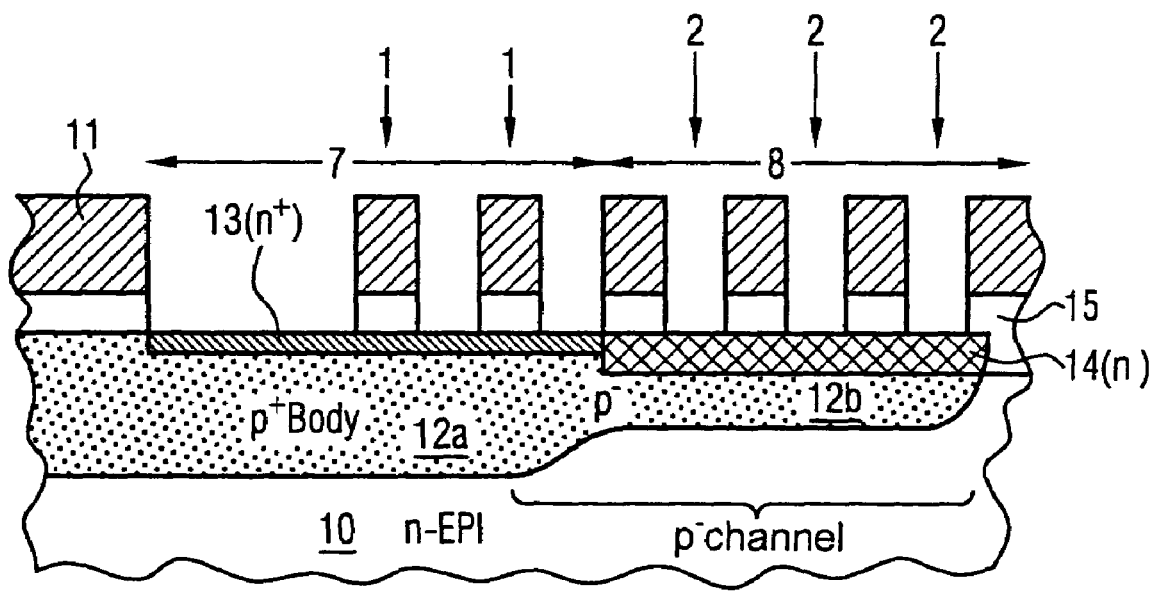
Figure 1C:
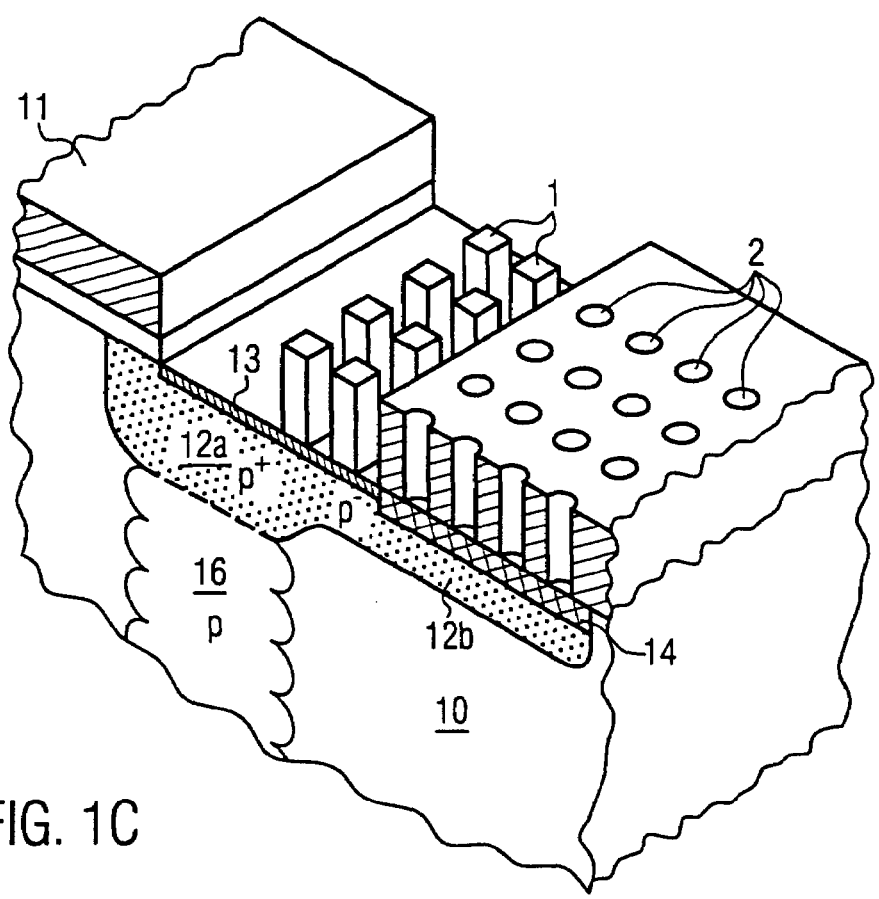
FIG. 1C is a perspective illustration of the section of an NMOS-FET cell in accordance with FIG. 1B.

Referring now to the figures of the drawing in detail and first, particularly, to FIGS. 1A to 1C thereof, there is shown a first embodiment of a method according to the invention for forming a channel zone of an NMOS field-effect transistor.

Firstly, in accordance with FIG. 1A, holes 2 are formed in the gate region and bars 1 are formed in the source region in a polysilicon layer 11. The holes 2 and the bars 1 reach the plane of an n-type epitaxial layer 10, in which a p-type well defining a p-type channel is intended to be formed. The holes 2 in the gate region 8 and the bars 1 in the source region 7 serve as a mask for a doping step illustrated with reference to FIG. 1B. At least one of the parameters form, spacing, number and diameter in each case of the holes 2 and of the bars 1 is critical for the doping profile of the p-type channel zone that is established after the diffusion in accordance with FIG. 1B. In accordance with FIG. 1B, which shows the state of the field-effect transistor cell after the diffusion, the section 12A (body) in the source region 7 is $p^+$-doped and extends deeper into the n-type epitaxial layer 10 than the section 12b of the p-type channel zone in the gate region 8, where the section 12b of the p-type channel zone is $p^-$-doped. In the $p^-$-type region 12b, an $n^-$-type depletion-mode implantation can then be effected in order to form a gate electrode 14 for a depletion-mode FET by means of a masked or whole-area As or P implantation. A source electrode 13 can then be implanted in a customary manner in the source region.

An exemplary form and arrangement of holes 2 in the gate region 8 and of bars 1 in the source region 7 is shown in the cut-away perspective view of FIG. 1C. It goes without saying that this form and arrangement of holes 2 and bars 1 is only by way of example, and it should be clear that the doping profile in each case of the p-type channel zone 12b in the gate region 8 and of the $p^+$-type channel zone 12a in the source region 7 is adjustable through the choice of at least one of the parameters form, spacing, number and/or diameter of the holes in the gate region 8 and of the pillars 1 in the source region 7. FIG. 1C also shows the pillar-shaped p-type conduction section 16 of a vertical MOSFET cell, for example of a coolMOS™-FET cell, which section extends into the depth of the n-type epitaxial layer 10 below the deeply extending $p^+$-type body region.

It should be mentioned that the $n^+$-type source electrode 13 can be produced as usual by means of spacer technology or else in another way.

Figure 3:
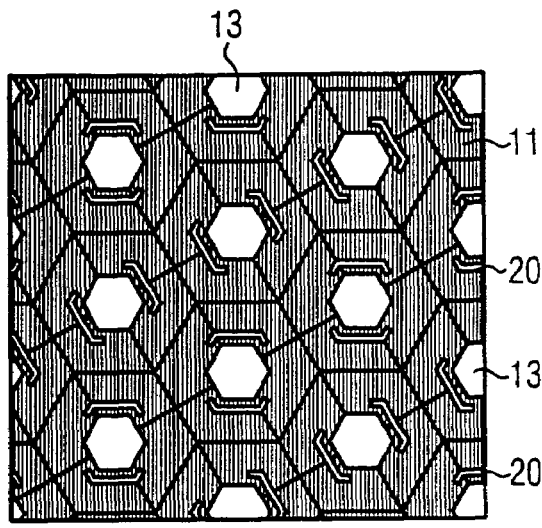
FIG. 3 is a diagrammatic plan view similar to FIG. 2A, with a channel width shading of a MOSFET transistor cell array in accordance with a third alternative of the method according to the invention.
Figure 4:
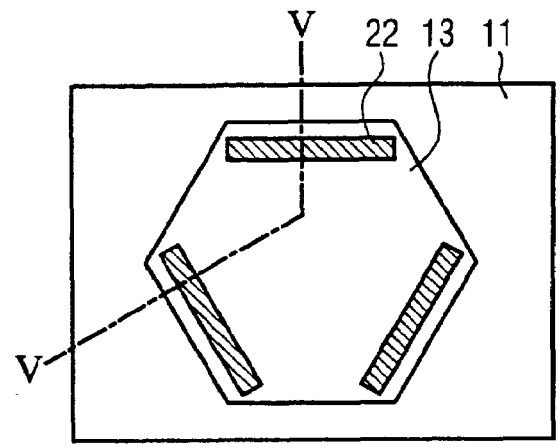
FIG. 4 is a diagrammatic plan view of a MOSFET transistor cell which illustrates a further variant of a channel width shading.
Figure 5:
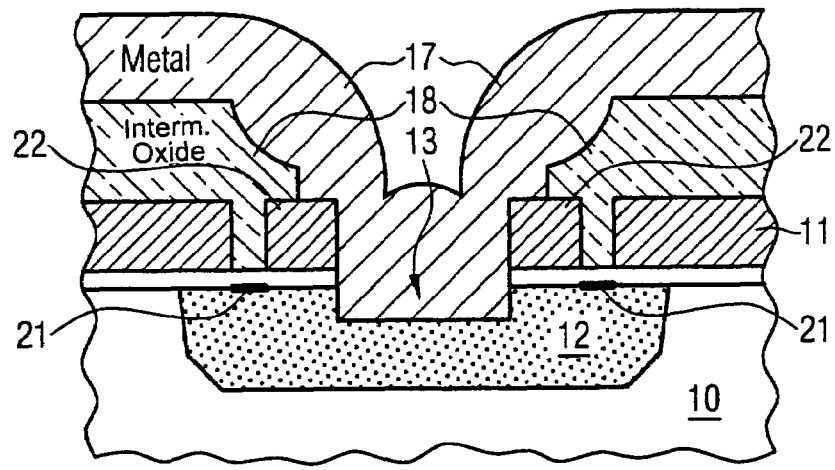
FIG. 5 is a sectional view taken along the section line V—V of the FET cell of FIG. 4.
Figure 6:
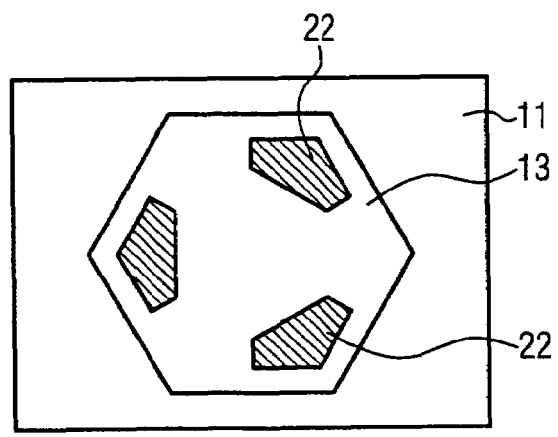
FIG. 6 is a diagrammatic plan view of a FET cell which shows a design variant of the channel width shading in accordance with FIG. 4.
Figure 7:
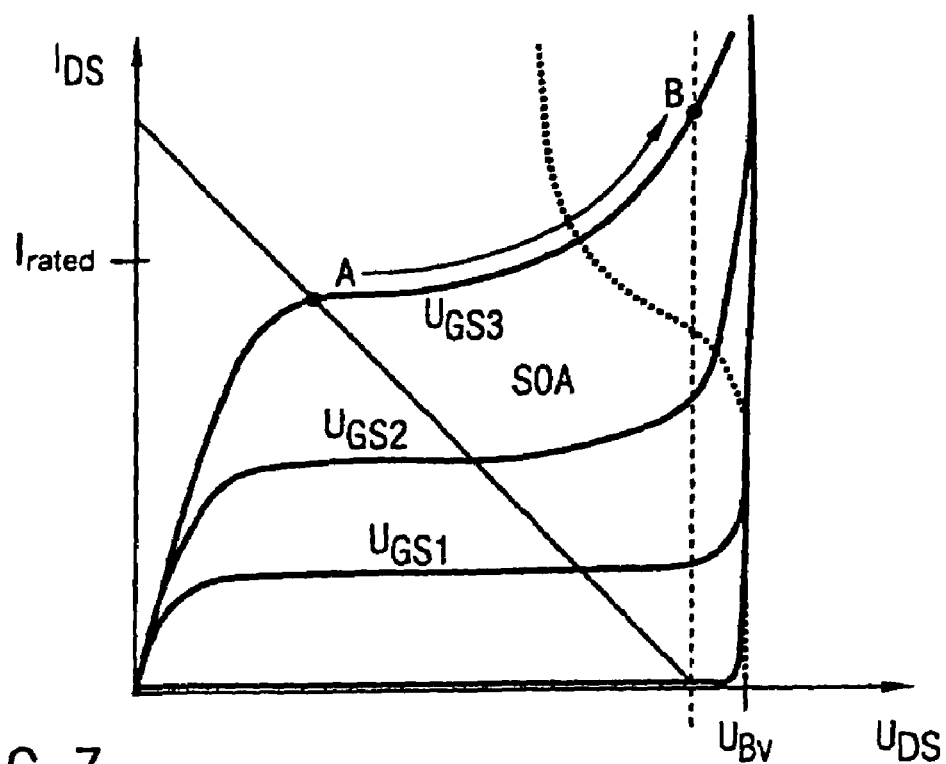
FIG. 7 is a graph plotting the already described family of characteristic curves of a MOS field-effect transistor.
Figure 8:
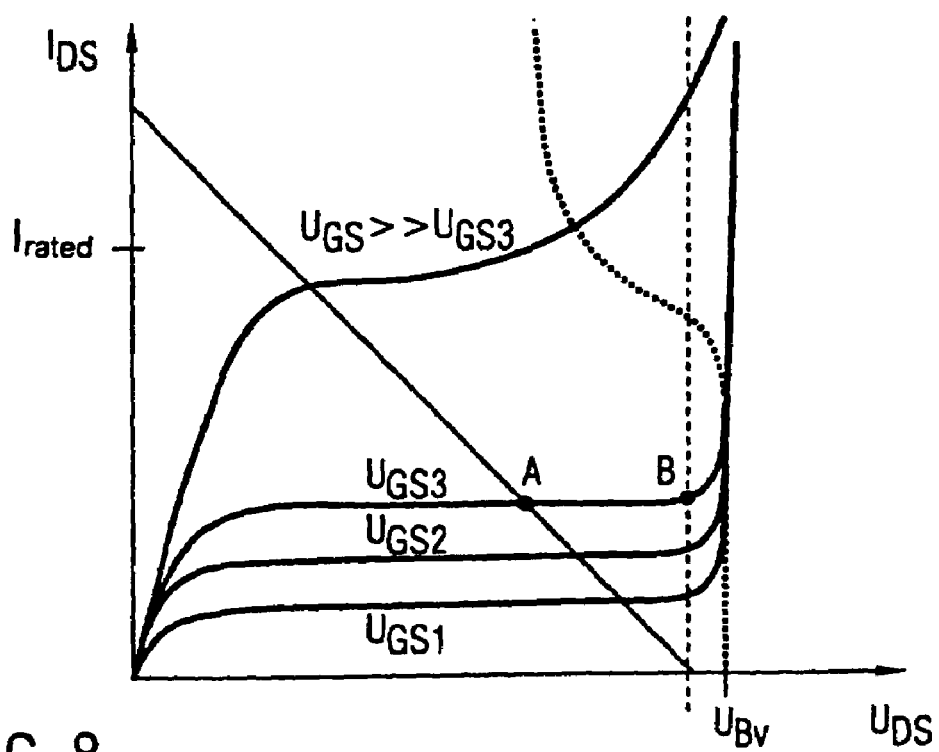
FIG. 8 is a graph plotting a family of characteristic curves for a MOS field-effect transistor with channel width shading (already described)

Furthermore, a method for channel width shading in the case of an exemplary vertical NMOS transistor is described with reference to FIGS. 2A, 2B to 6, which is implemented by means of slots 20 (FIGS. 2A, 2B and 3) in the polysilicon 11 or by means of webs 22 made of polysilicon 11 within the poly-hole 13 (FIGS. 4 to 6).

The method according to the invention for channel width shading aims to appreciably increase the resistance of the channel or of the lead on a proportion of the channel width. In accordance with FIGS. 2A, 2B and 3, the corresponding channel regions of adjacent cells are connected to one another by means of a p-doped region. By virtue of this connection, a continuous potential gradient does not occur in the p-doped region and the channel thus appears to have an infinite length in these regions. A restricted or shaded channel width can thus be utilized for charge carriers. Consequently, during the implantation for fabricating the channel regions, the p-type dopant (e.g. As or P) is also introduced into the slots 20, thereby connecting the actual channel regions of adjacent cells. The gate resistance could represent a problem in this method. The increase in the gate resistance can be counteracted by a gate ring. The variant shown in FIG. 2B differs from that in FIG. 2A in that the gate resistance is reduced to a lesser extent there. The variant shown in FIG. 3 differs from the embodiments of FIGS. 2A and 2B in terms of the more favorable form of the slots 20, which curve partly around the hexagonal form of the poly-holes 13. Two slots 20 of this type are provided per poly-hole 13, for symmetry reasons, such that there is always only one slot 20 pointing toward the adjacent hexagonal poly-hole 13.

Figure 9:
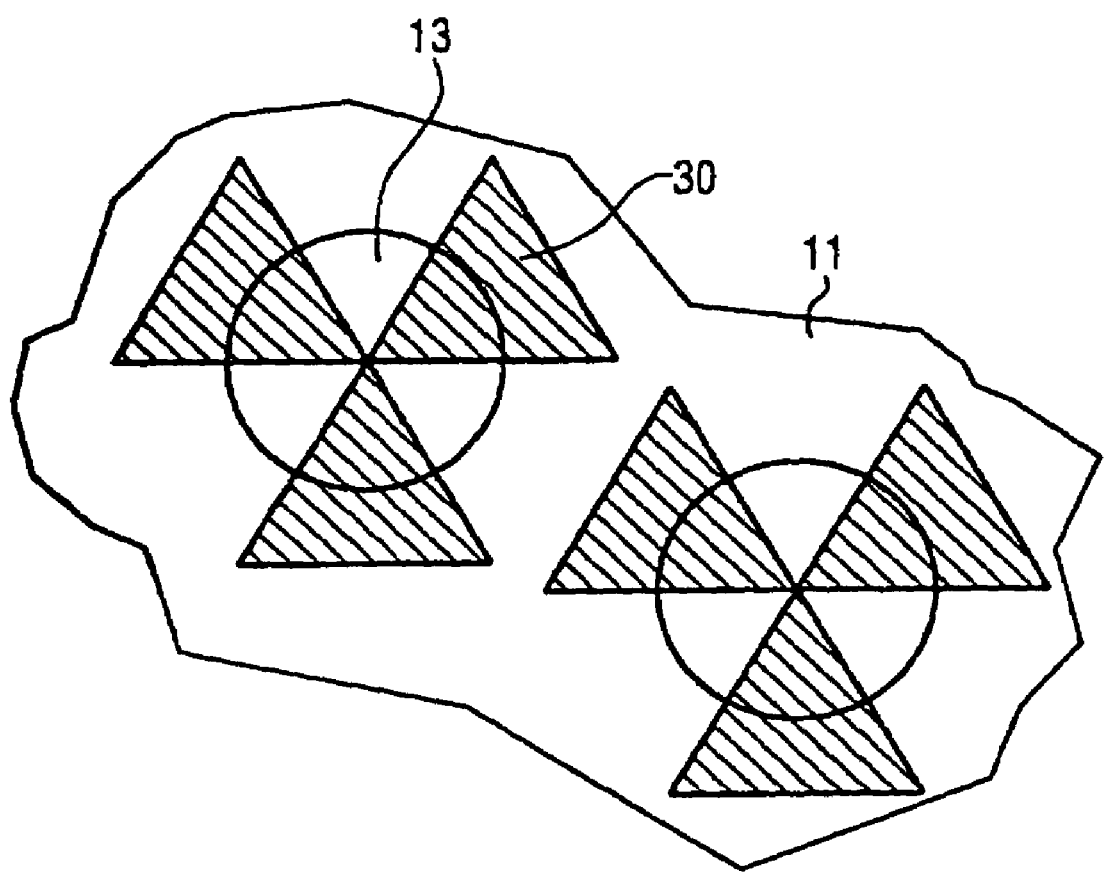
FIG. 9 is a diagrammatic plan view of two adjacent field-effect transistor cells which illustrates the conventional method for channel width shading already described in the introductory text.

In addition to obviating the phototechnology for forming the resist mask 30 as described in the introduction with reference to FIG. 9, the proposed method affords a further significant advantage for the performance of the transistor: the gate capacitance of the transistor is heavily reduced since p-doped regions are not to be prescribed to this capacitance.

Figure 2A:
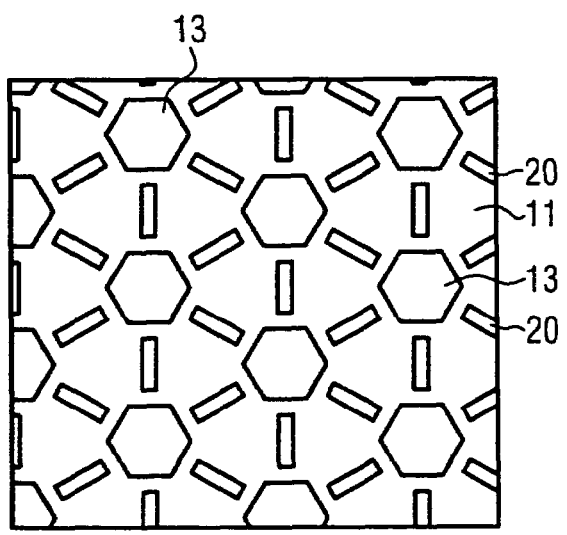
FIG. 2A is a diagrammatic plan view of an array of MOS-FET transistor cells whose channel width is shaded by means of a first alternative of the method according to the invention.
Figure 2B:
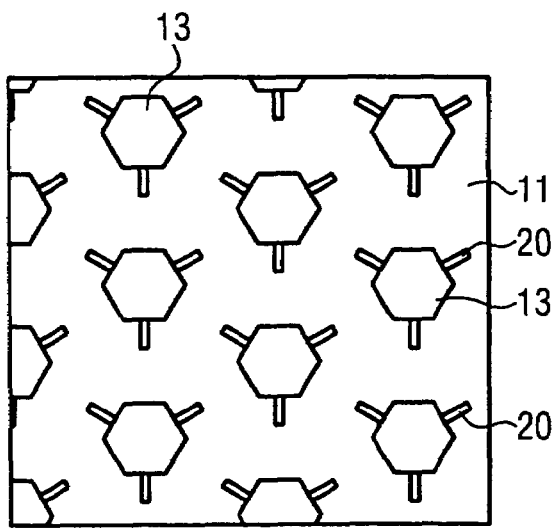
FIG. 2B is a diagrammatic plan view similar to FIG. 2A, with a channel width shading of a MOSFET transistor cell array in accordance with a second alternative of the method according to the invention.

Apart from the embodiment of a channel width shading according to the invention as illustrated in FIGS. 2A, 2B and 3, there is also the possibility of shading only a part of the channel terminal (source region) within the transistor cell. This embodiment is illustrated with reference to FIGS. 4 to 6. In this case, webs 22 made of polysilicon are left behind within the poly-hole 13 and are short-circuited with the source channel terminal. These poly-webs 22 serve as masking for the arsenic implantation. However, the method illustrated with reference to FIGS. 4 to 6 has the disadvantage that the contact hole form is impaired and pentode jeopardization thus exists.

While FIG. 4 shows a diagrammatic plan view of a FET transistor cell whose channel width has been shaded according to the invention, FIG. 5 illustrates a sectional view through the same FET transistor cell along the section line V—V depicted in broken fashion in FIG. 4. The following are shown from bottom to top: the n-type epitaxial layer 10, the p-type well 12, arsenic implantation regions 21, the polysilicon layer 11, which serves as source and gate terminal, the webs 22 in the poly-hole 13, which are spaced apart from the polysilicon layer 11, an intermediate oxide 18 and a metal layer 17 for the contact connection of the gate electrode/source electrode and of the poly-webs 22. The metal layer 17 passes through the poly-hole 13 and contact-connects the p-type well 12.

It should be noted that various experiments in the meantime indicate that the transconductance β of the transistor can also be varied well by means of the lead resistance (As implantations). This could mean, for example, providing $p^{++}$ with a higher dose. However, this measure could have a very disadvantageous effect on the on resistance $R_{on}$.

The method according to the invention for the channel width shading of integrated NMOS transistor cells which has been described above and illustrated with reference to FIGS. 2A, 2B to 6 has the advantage that an entire photolithography plane is obviated and that the gate capacitance of the transistor is heavily reduced. With these advantages, a coolMOS™ transistor improved by means of the method according to the invention can venture into market segments hitherto held to be unattainable. Similar advantages to those described above for vertical MOSFETs also apply to lateral MOSFETs and to IGBTs.

We claim:

1. In a MOS field-effect transistor cell having an epitaxial layer in which a gate region and a source region are formed below a polysilicon layer, the gate and source regions defining a channel zone in the epitaxial layer below the polysilicon layer, a body zone in the source region extends deeper into the epitaxial layer than that in the gate region and an impurity concentration of the body zone in the source region is greater than an impurity concentration of the body zone in the gate region, the improvement which comprises:

the polysilicon layer having holes formed in the gate region and pillars formed in the source region.

2. The MOS transistor cell according to claim 1 configured as a vertical depletion-mode MOS field-effect transistor cell.

3. The MOS transistor cell according to claim 1 configured as a coolMOST™ cell.

4. A MOS transistor cell, comprising: a channel zone having a source region and a source electrode connected to said source region, a polysilicon layer lying above said channel zone, said polysilicon layer having slots or webs formed in sections thereof above said channel zone, said slots or webs being introduced to connect respective channel zones of adjacent transistor cells and said webs being residual portions of said polysilicon layer, lying within a polysilicon hole delimiting said source region, and being short-circuited with said source electrode.

5. The MOS transistor cell as claimed in claim 4 formed as a vertical depletion-mode MOSFET transistor cell.

* * * * *